United States Patent [19]
Hsu

[11] Patent Number: 5,468,657
[45] Date of Patent: Nov. 21, 1995

[54] NITRIDATION OF SIMOX BURIED OXIDE

[75] Inventor: Sheng T. Hsu, Camas, Wash.

[73] Assignees: Sharp Microelectronics Technology, Inc., Camas, Wash.; Sharp Kabushiki Kaisha, Osaka, Japan

[21] Appl. No.: 261,443

[22] Filed: Jun. 17, 1994

[51] Int. Cl.$^6$ ........................................... H01L 21/76
[52] U.S. Cl. .................. 437/24; 437/26; 437/27; 437/62
[58] Field of Search ................ 437/24, 26, 27, 437/62; 148/DIG. 85, DIG. 86

[56] References Cited

U.S. PATENT DOCUMENTS

| | | | |
|---|---|---|---|
| 4,774,197 | 9/1988 | Haddad et al. | 437/27 |
| 4,786,608 | 11/1988 | Griffith | 437/26 |
| 4,948,742 | 8/1990 | Nishimura et al. | 437/24 |
| 4,968,636 | 11/1990 | Sugawara | 437/24 |
| 5,266,502 | 11/1993 | Okada et al. | 437/24 |
| 5,278,077 | 1/1994 | Nakato | 437/27 |

FOREIGN PATENT DOCUMENTS

| | | | |
|---|---|---|---|
| 556795 | 8/1993 | European Pat. Off. | 437/62 |

*Primary Examiner*—George Fourson
*Attorney, Agent, or Firm*—David C. Ripma

[57] ABSTRACT

A method is provided for improving the electrical isolation between surface regions and underlying support regions in SIMOX buried oxide wafers. The method implants nitrogen ions into a wafer to approximately the same depth as oxygen ions are implanted during SIMOX processing. A subsequent heating step causes the nitrogen ions to migrate to the interface region between the buried oxide and the upper and lower semiconductor regions of the substrate. The nitrogen passivates the interface regions to reduce the presence of buried free electrons trapped in the substrate. Nitrogen implantation can be performed before, during, or after the oxygen is implanted. Nitrogen ions can also be implanted after the SIMOX buried silicon dioxide layer has been formed. If the latter alternative is followed, the wafer must be subsequently heated to migrate the nitrogen ions to the interface regions within the substrate. Such subsequent heating can be performed as part of the formation of devices on the substrate. The resultant nitrogen passivated SIMOX substrate has improved electrical isolation between surface active devices and the supporting substrate. The invention also yields a substantial increase in the breakdown voltage of the buried oxide layer.

16 Claims, 5 Drawing Sheets

NITRIDATION OF SIMOX BURIED OXIDE

BACKGROUND AND SUMMARY OF THE INVENTION

The invention relates generally to methods of fabricating semiconductor materials, and more particularly to a method of forming a semiconductor substrate for use in the manufacture of integrated circuit devices, the substrate including a buffed insulating layer for electrically isolating surface regions from underlying supporting regions of the substrate.

An area of ongoing research in the manufacture of large-scale integrated circuits is the use of silicon wafers processed to include a buried insulating layer beneath the wafer surface. One technique for forming silicon substrates with a buried insulating layer is referred to by the acronym SIMOX (for "Separation by IMplanted OXygen"). In SIMOX processing a monocrystalline silicon wafer is implanted with a beam of oxygen ions accelerated at high energies and directed through the surface of the wafer. The oxygen ions come to rest at a selected depth within the wafer substrate. The result is a buffed region of implanted oxygen extending between upper and lower layers of monocrystalline silicon. The silicon wafer is then annealed, causing a redistribution of the oxygen ions to form a substantially uniform buffed layer of silicon dioxide ($SiO_2$) in the wafer. Annealing tends to sharpen the demarcation between the buffed layer of silicon dioxide and the adjacent layers of monocrystalline silicon, and annealing also repairs the damage to the crystalline structure of the upper or superficial silicon layer, which is damaged by the ion implantation.

The buried layer of silicon dioxide which results from SIMOX processing improves the performance of integrated circuit formed on the wafer. That is because the oxide electrically isolates the surface layer of silicon, where semiconductor devices are fabricated, from the bulk portion of the wafer beneath the silicon dioxide layer. The silicon dioxide tends to minimize capacitance between the active devices on the surface and the supporting substrate. It also helps prevent the development of electrical paths through the wafer which can degrade or destroy surface devices.

One problem associated with SIMOX processing is that the ion bombardment and subsequent sealing can leave broken Si—O and Si—Si bonds buried within the substrate, generally adjacent the interface regions between the silicon dioxide layer and the upper and lower silicon layers. Such broken bonds are a source of free electrons and trapped electric charge in the substrate which can cause undesired current paths to develop between active devices and the supporting wafer. Trapped electrical charge lowers the breakdown voltage of the buffed oxide and reduces its hot electron immunity. As such, broken molecular bonds in the interfacial regions around the buffed oxide layer produce an increase in defects in integrated circuits formed on the wafer, can cause poor device performance, and lowers the overall quality of the fabricated wafer.

Nitrogen passivation is a technique which is used to counter the harmful effects of broken molecular bonds and trapped electrical charge in semiconductor wafers. "Passivation" involves the introduction of free nitrogen ions into the vicinity of defective molecules, which allows the nitrogen to join and form stable bonds with the broken molecules, reducing the number of free electrons. Surface regions of a silicon substrate, such as the gate oxide region, can be readily passivated by nitrogen diffusion or shallow implantation. If devices are formed on a substrate that includes a surface layer of deposited polysilicon, the introduction of nitrogen by such shallow-penetration techniques has little or no harmful effect on device performance. Polysilicon in active devices is highly tolerant of nitrogen. However, active devices formed in monocrystalline silicon are seriously degraded by the presence of nitrogen. Therefore, it would be advantageous to employ a methodology for passivating the interface regions adjacent a buffed oxide insulating layer which does not introduce undesirable nitrogen into the surface silicon layer.

It would also be advantageous to be able to increase the electrical isolation between the upper and lower semiconductor regions in a silicon wafer manufactured using the SIMOX methodology.

It would also be advantageous to improve the buried oxide breakdown voltage in a SIMOX substrate without degrading the gate silicon incorporated into active devices fabricated on the substrate.

Accordingly, a method of increasing the electrical isolation in a semiconductor substrate is provided. The method is used in a substrate of the type which, when processing is completed, includes a buffed insulating layer formed between upper and lower semiconductor regions, the buffed insulating layer being centered at a depth D beneath the top surface of the substrate. Increased electrical isolation between the upper and lower semiconductor regions, in accordance with the invention, is provided by the following steps: (a) implanting nitrogen ions into the substrate to the depth of the buried insulating layer; and (b) heating the substrate to cause migration of nitrogen ions to the interface regions extending between the buried insulating layer and the upper and lower regions of the semiconductor substrate. The result of the method is passivation of the interface regions by the nitrogen, thereby increasing the electrical isolation between the upper and lower semiconductor regions.

In its preferred form, the method is carried out in conjunction with SIMOX processing of a silicon wafer substrate. SIMOX requires the implantation of oxygen ions in the substrate to a selected depth below the top surface of the substrate. After oxygen implantation, the substrate is annealed to form a buried insulating region of oxide between upper and lower semiconductor regions within the substrate. During SIMOX annealing, the implanted oxygen ions are redistributed and bond to the silicon of the substrate, forming the buried silicon dioxide layer characteristic of SIMOX. The method of the present invention can be carried out as part of the SIMOX process. The aforementioned, step (a) of implanting nitrogen ions into the substrate can be performed before or after the implantation of oxygen ions in the SIMOX process, or substantially simultaneously with the oxygen implantation. The aforementioned heating step (b), in the method of the present invention, can be performed during the annealing step of the SIMOX process. In conjunction with the present invention, SIMOX annealing causes migration of the implanted nitrogen ions to the interface regions extending between the buried silicon dioxide layer and the upper and lower semiconductor regions of the substrate.

An alternative embodiment of the method of the present invention allows for completion of the SIMOX process prior to nitrogen ion implantation. In this alternative, a monocrystalline silicon substrate is implanted with oxygen ions and annealed to form a buried silicon dioxide region within the substrate. Subsequently, the aforementioned step (a) of implanting nitrogen ions, and step (b) of heating the substrate, are performed. In this alternative, the heating step (b) is performed separately from the SIMOX annealing step since the SIMOX annealing step was completed before nitrogen implantation. Instead, the substrate is heated in a separate step (b) to cause migration of the nitrogen ions. Or the separate heating step (b) can be carried out during the subsequent processing of the substrate to form active devices on its surface.

One use of the invention is to form active semiconductor devices on a monocrystalline silicon substrate processed in accordance with SIMOX techniques. The method allows the formation of one or more active devices, such as MOS FETs, on a substrate with a nitrogen-passivated buried oxide layer, wherein the channel region of the devices are substantially free of implanted nitrogen. The channel regions are therefore not degraded by the presence of nitrogen, which otherwise adversely affects the performance of devices formed in monocrystalline silicon.

The preferred implantation energies and doses used in the nitridation of SIMOX buried oxide process of the present invention are as follows: oxygen ions are preferably implanted to a selected depth D using an implant dose generally in the range of $1.0 \times 10^{17}$ to $3.0 \times 10^{18}$ ions/cm$^2$ with an ion implantation energy generally in the range of 30 KeV to 120 KeV. Nitrogen ions are implanted to generally the same depth as the depth D of the oxygen ions using an implant dose generally in the range of $1.0 \times 10^{11}$ to $1.0 \times 10^{13}$ ions/cm$^2$ with an ion implantation energy which is generally in the range of between zero percent (0%) to twenty five percent (25%) less than the ion implantation energy used to implant the oxygen ions. The annealing temperature and duration used with the present invention are conventional for SIMOX processing. If the substrate is heated subsequent to SIMOX annealing, in order to cause migration of the nitrogen ions to the interfacial regions between the oxide layer and the semiconductor layers, the heating step generally requires heating the substrate to between 700° C. and 1350° C. for between 10 minutes and 12 hours. Preferably, the heating step, following SIMOX annealing, is performed by heating the substrate to a temperature generally in the range of 700° C. to 1000° C. for between 10 minutes and 1 hour.

DETAILED DESCRIPTION OF THE PREFERRED EMBODIMENT

Figure 1A:
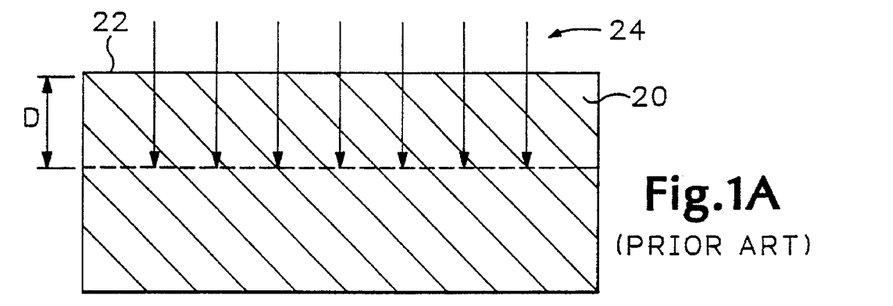
FIG. 1A is a partial cross-sectional schematic view of a silicon substrate during the SIMOX processing step of implanting oxygen ions into the substrate to a predetermined depth D (prior art).

The present invention is an improved SIMOX processing methodology which uses some conventional SIMOX processing steps together with other steps, as described below. A first embodiment of the method of the present invention is illustrated with reference to FIGS. 1A–1D. Beginning with a semiconductor substrate 20, which is preferably a wafer of monocrystalline silicon having a first or upper surface 22, oxygen ions are implanted into substrate 20 using an oxygen ion beam illustrated schematically at 24. The oxygen ion beam is directed through first surface 22 into the body of substrate 20. The implant dose is preferably generally in the range of $1.0 \times 10^{17}$ to $3.0 \times 10^{18}$ ions/cm$^2$. The oxygen ion implantation energy used in the step illustrated in FIG. 1A is generally in the range of 30 KeV to 120 KeV. The ambient temperature of substrate 20 during the oxygen implantation step is preferably in the range of 500° to 800° C. with the preferred ambient temperature being 600° C. As is well-known in the art, implanted ions will come to rest in a Gaussian distribution pattern within the substrate, the approximate center of the distribution pattern being at a predetermined depth D beneath the surface 22 of substrate 20. The result of the oxygen implantation step shown in FIG. 1A is the formation of a implant region or layer 30 containing implanted oxygen ions within the silicon of substrate 20, as shown schematically in FIG. 1B (prior art).

Figure 1B:
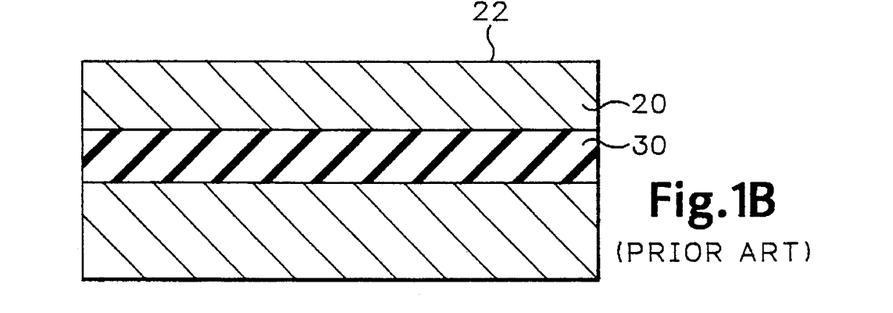
FIG. 1B is a partial cross-sectional view of the substrate shown in FIG. 1A illustrating the implanted layer of oxygen ions extending between upper and lower semiconductor regions of the substrate, as a result of the step illustrated in FIG. 1A (prior art).

The next step in conventional SIMOX processing is to anneal the structure shown in FIG. 1B to eliminate defects in the substrate caused by the oxygen ion implantation. In the method of the present invention the annealing step can be performed before or after the implantation of nitrogen ions described in the following paragraph. In the first embodiment of the invention described with reference to FIGS. 1A–1D the annealing step is performed subsequent to nitrogen implantation. Consequently, a detailed description of the annealing step will be deferred.

Figure 1C:
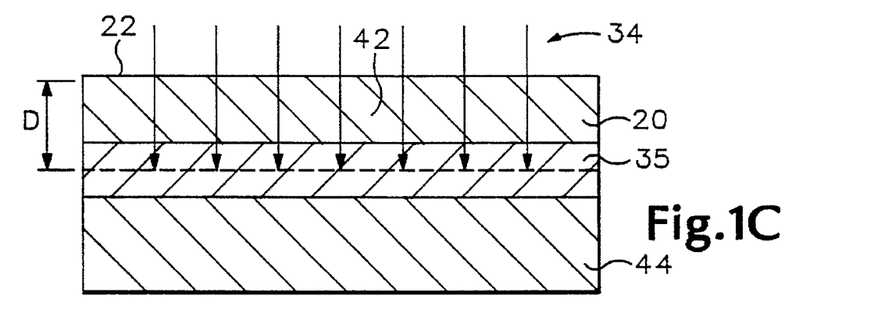
FIG. 1C is a partial cross-sectional view of the substrate shown in FIG. 1A during the step of implanting nitrogen ions into the substrate to depth D in accordance with the present invention.

Referring to FIG. 1C, the next step in the first embodiment of the invention is the implantation of nitrogen ions into substrate 20 using a nitrogen ion beam 34. Nitrogen ions are implanted to the same general depth D as the depth of the implanted oxygen ions 30 in the oxygen implantation step illustrated in FIGS. 1A and 1B. The implant dose of nitrogen ions is preferably generally in the range of $1.0\times10^{11}$ to $1.0\times10^{13}$ ions/cm$^2$. The implantation energy used in the nitrogen implantation step is preferably approximately the same as, or slightly lower than, the implantation energy used in the oxygen ion implantation step illustrated in FIG. 1A. More specifically, the nitrogen ion implantation energy is generally in the range of between zero percent (0%) to twenty-five percent (25%) less than the ion implantation energy used to implant oxygen ions into the substrate in the step illustrated in FIG. 1A. The selection of the exact ion implantation energy used is dependent on the depth to which the nitrogen ions penetrate the substrate. Experimentation during wafer processing will guide the experienced processing engineer to arrive at the correct nitrogen ion implantation energy for implanting the nitrogen ions to depth D (depth D being the center of the distribution curve of implanted nitrogen ions). The ambient temperature of substrate 20 during the nitrogen implantation step is preferably between ambient room temperature (10° C.–25° C.) and approximately the same ambient temperature used during the oxygen implantation step (500° C. to 800° C.). The result of the step shown in FIG. 1C is the implantation of nitrogen ions into the same general vicinity as the oxygen ions are implanted within substrate 20. Layer 35 represents implanted oxygen and nitrogen ions within substrate 20.

The next step in the method is to anneal the structure resulting from the step shown in FIG. 1C. Annealing is carried out in substantially the same manner as in conventional SIMOX processing. With the substrate surrounded by a predominantly nitrogen atmosphere, containing perhaps 0.25% oxygen, the ambient temperature is raised to a suitable annealing temperature, generally in the range of between 1100° C. to 1360° C. Annealing is carried out for approximately 6 hours. Overall annealing times can range from less than 1 hour to 12 hours. During annealing, the implanted oxygen ions are redistributed within the silicon substrate to form a layer of nitrogen-implanted silicon dioxide 40. The effect of annealing on the distribution of nitrogen ions within layer 40 is discussed below with reference to FIGS. 2 and 3. With regard to the implanted oxygen, annealing tends to sharpen the demarcations between the buried silicon dioxide layer and the upper and lower semiconductor regions or layers 42, 44. Semiconductor layers 42, 44 are monocrystalline silicon. The layers 40, 42, 44 within substrate 20 are divided by interface regions 51, 52, which are adjacent-layer boundaries extending laterally through the substrate. The upper semiconductor layer 42 overlies silicon dioxide layer 40, extending to first surface 22. The lower semiconductor layer 44 extends below silicon dioxide layer 40. Upper semiconductor layer 42 usually sustains damage to its crystalline structure during ion implantation. The annealing step, in addition to its other purposes, tends to repair defects in silicon layer 42 through recrystallization.

The depth D shown in several of the figures, i.e., the approximate distance from first surface 22 of substrate 20 to the approximate center of insulating layer 40 (shown in FIG. 1D), is typically in the range of 4,000 Å, to 10,000 Å, if conventional SIMOX processing is used during oxygen ion implantation. The buried oxide layer in a SIMOX wafer has a thickness of approximately 3,000 Å to 7,000 Å, and the nitrogen-implanted oxide layer 40 in FIG. 1D will generally have a similar thickness. The thickness of upper semiconductor layer 42 is generally in the range of Å A to 8,000 Å. The present invention can also be employed with "shallow" SIMOX wafer processing in which the buried nitrogen-implanted oxide layer is as thin as 400 Å and is buried beneath an ultrathin upper monocrystalline silicon layer 42 with a thickness as thin as approximately 100 Å. Regardless of whether conventional SIMOX-type implantation depths are used during oxygen and nitrogen implantation, or whether shallow SIMOX-type implantation depths are used, the present invention produces a wafer substrate with an upper monocrystalline silicon layer 42 that is substantially free of nitrogen.

Figure 1D:
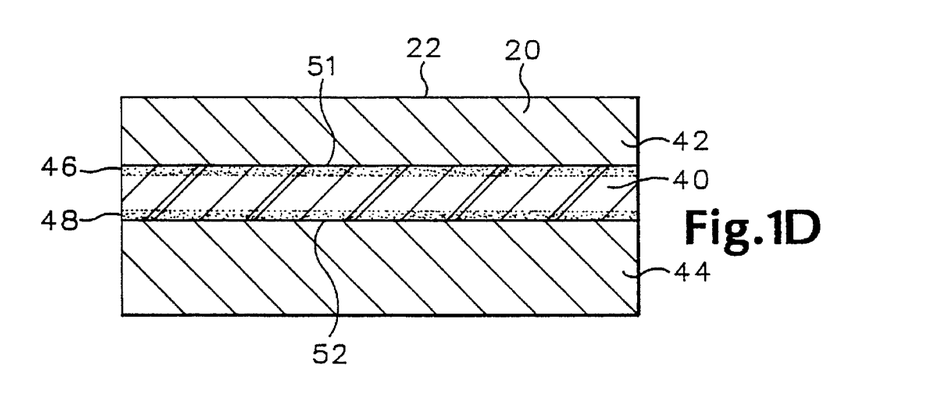
FIG. 1D is a partial cross-sectional view of the substrate shown in FIG. 1A illustrating the structure of the wafer which results from processing the substrate in accordance with the present invention.
Figure 2:
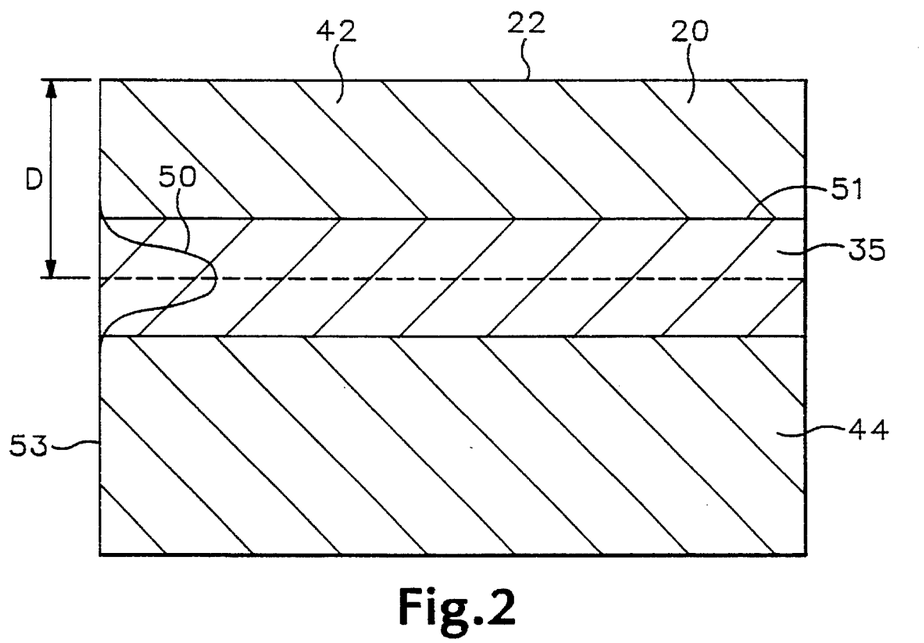
FIG. 2 is a partial cross-sectional schematic view, on an enlarged scale, of the silicon substrate shown in FIG. 1C, following the nitrogen implantation step, including an overlay graphical plot showing the approximate concentration of implanted nitrogen ions resulting from the nitrogen implantation step.

The annealing step, performed between the steps illustrated in FIGS. 1C and 1D, redistributes the implanted nitrogen ions within layer 40. FIG. 2 reproduces, on an enlarged scale, the substrate 20 as it exists immediately following the nitrogen implantation step illustrated in FIG. 1C. A depth profile and Gaussian distribution pattern of implanted nitrogen ions is superimposed at 50. The density of implanted nitrogen ions is indicated by the distance of curve 50 from the left edge 53 of substrate 20. The center of the implanted nitrogen distribution in FIG. 2 is at approximately the same depth D as the depth of implanted oxygen ions in FIG. 1A. In other words, the highest density of nitrogen ions is located at a depth D below first surface 22, at approximately the same location as the highest density of implanted oxygen ions in the implant region 30 of FIG. 1B. The concentration of implanted nitrogen ions falls off to approximately zero at the edges of the interface regions 51, 52 that extend between the oxygen-nitrogen implant region 35 and the upper and lower semiconductor regions 42, 44, respectively.

Figure 3:
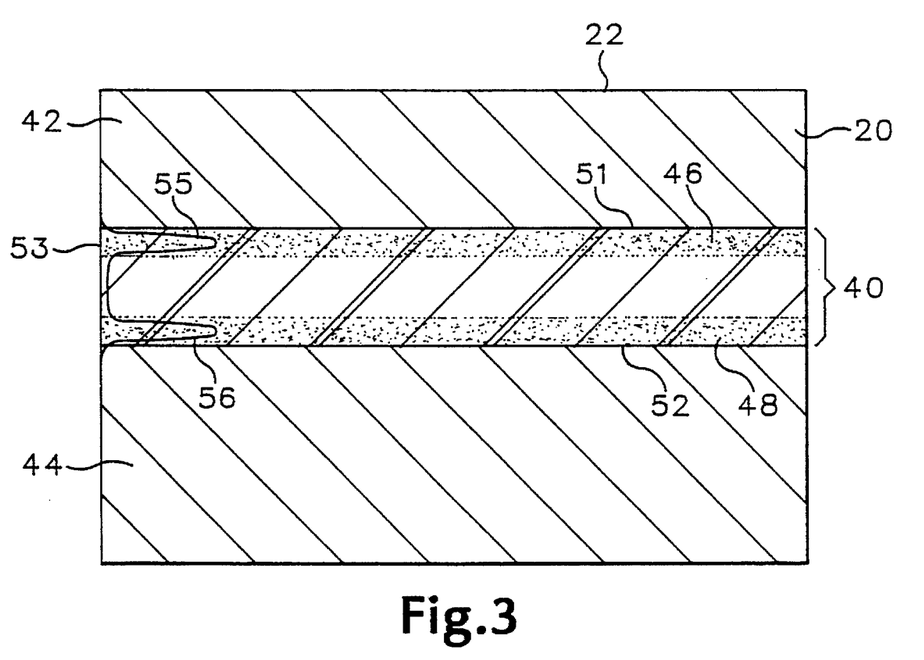
FIG. 3 is a partial cross-sectional schematic view of the substrate shown in FIG. 2, following the heating step of the present invention, including an overlay graphical plot showing the approximate concentration of redistributed nitrogen in the wafer.

FIG. 3 shows the distribution of implanted nitrogen ions in substrate 20 following the heating step, wherein substrate 20 is heated during annealing. In FIG. 3, the oxygen-nitrogen implantation layer 35 has been converted to a nitrogen-implanted buried oxide layer 40 (also shown in FIG. 1D). After annealing, the interface regions 51, 52 between oxide layer 40 (of silicon dioxide implanted with nitrogen) and the upper and lower semiconductor layers 42, 44, respectively, become well defined. The heating which occurs during annealing distributes the oxygen ions more or less uniformly throughout oxide layer 40 and also causes the implanted nitrogen ions to migrate toward interface regions 51, 52, as shown graphically by Gaussian, distribution curves 55, 56. In FIGS. 1D and 3 the redistributed implanted nitrogen is shown schematically by stippling in two thin interfacial zones 46, 48. The nitrogen ions are shown concentrated along the edges of the oxide layer, predominately within the interface boundaries 51, 52, which approximates the actual locations of the implanted nitrogen following the step of heating substrate 20 to cause migration of the implanted nitrogen. Accordingly, the stippling in FIGS. 1D and 3 is illustrated as being within layer 40, adjacent boundaries 51, 52. Curves 55, 56 provide an alternative graphic illustration of the nitrogen ion distribution within interface zones 46, 48.

The nitrogen ions in interface zones 46, 48 serve to passivate the trapped charge which results from broken silicon and oxygen bonds that populate the areas immediately adjacent interface boundaries 51, 52. Broken molecular bonds are caused principally by the ion implantation process. They serve as undesirable sources of free electrons and holes which degrade the insulating properties of the buried silicon dioxide layer 40. Interface zones 46, 48 contain most of the broken molecular bonds created during SIMOX processing. The present invention neutralizes the harmful effects of the broken molecular bonds by providing concentrations of implanted nitrogen ions in the interfacial zones 46, 48. The nitrogen ions passivate those zones by chemically bonding to broken silicon and oxygen molecules. Passivation with implanted nitrogen creates stable nitride molecules which "tie" free electrons and create stable molecules of $Si_aN_b$ compounds and $Si_cO_dN_e$ compounds. Such nitride compounds are collectively referred to herein as "stable nitrogen compounds."

Figure 4:
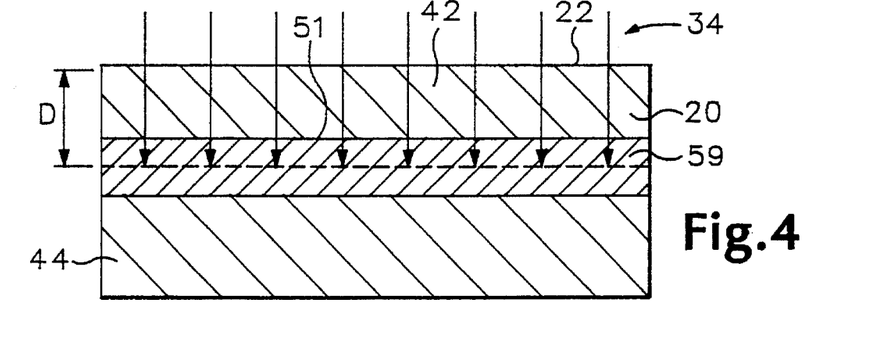
FIG. 4 is a partial cross-sectional schematic view of a silicon substrate processed to include a buried layer of silicon dioxide which is then subjected to nitrogen implantation through the surface of the substrate to the same general depth D as the depth of the silicon dioxide layer, creating a substrate with a nitrogen-implanted buried oxide layer.

An alternative embodiment of the present invention, also directed to nitrogen passivation of the interfacial regions 51, 52 of a buried oxide layer in a semiconductor substrate, will be described with reference to FIGS. 1A–1B and FIGS. 4–6. Referring to FIG. 4, a wafer 20, which started as a monocrystalline silicon substrate, is first processed in accordance with the steps shown in FIGS. 1A and 1B. Oxygen ions are first implanted to a depth D within the substrate. Then, before nitrogen is implanted, the substrate shown in FIG. 1B is annealed. The resultant structure is shown in FIG. 4. Substrate 20 has a buried layer of silicon dioxide 59, i.e., it is a conventional SIMOX wafer. Following SIMOX annealing, nitrogen ions are implanted into substrate 20, using nitrogen ion beam 34 (which is the same as beam 34 in FIG. 1C), to implant nitrogen ions to generally the same depth D as the oxygen ions were implanted. The nitrogen ions come to rest in an Gaussian distribution pattern within the buffed silicon dioxide layer 59. The pattern generally conforms to the pattern 50 shown in FIG. 2. The result of the step of implanting nitrogen ions into the buffed silicon dioxide layer 59, illustrated in FIG. 4, is a wafer 20 with an upper layer 42 of monocrystalline silicon, a middle layer 59 of nitrogen-implanted silicon dioxide, and a lower monocrystalline silicon layer 44. The principle difference between the substrate 20 in FIG. 4 and the nitrogen-implanted substrate illustrated in FIGS. 1C and 2 is that, in the latter figures, buffed layer 35 is an unannealed region containing implanted oxygen ions into which nitrogen ions are also implanted. In FIG. 4, nitrogen ions are implanted into a finished SIMOX wafer which has gone through the SIMOX annealing step to produce a buried silicon dioxide layer 59.

The step following nitrogen ion implantation into the SIMOX buried oxide layer shown in FIG. 4 is the heating of substrate 20 to cause migration of the nitrogen to interface regions 51, 52. The heating step can be accomplished several ways. One means of accomplishing the heating step is to heat substrate 20 in a silicon processing oven to the temperature required to effect the migration. It has been found that a wide range of temperatures and durations will cause the desired migration of nitrogen ions from their implant distribution, centered around implant depth D in layer 59, to the desired new locations adjacent interface regions 51, 52. For example, it has been found that the desired migration of implanted nitrogen results from heating substrate 20 to a temperature of 700° C. or higher for approximately ten minutes. The temperature used in the heating step should preferably not exceed 1350° C., which is approaching the melting point of silicon. Consequently, the overall range of the heating step, following the step illustrated in FIG. 4, is preferably generally in the range of between 700° C. and 1350° C. for a duration of between 10 minutes and 12 hours.

The resultant structure of substrate 20, following the heating step described in the preceding paragraph, is essentially the same as is illustrated in FIG. 1D. The nitrogen-implanted buried oxide layer 59 is converted to a nitrogen-passivated buried SIMOX layer 40, with the nitrogen molecules concentrated in zones 46, 48 adjacent interface regions 51, 52, respectively. The heating step described in the preceding paragraph can alternatively be accomplished by processing wafer substrate 20 to form active semiconductor devices on the substrate. Such processing virtually always includes heating sufficient to cause the desired redistribution of nitrogen ions from their implant locations in layer 59 of FIG. 4 to the locations shown and described with reference to FIG. 1D. What follows is a brief explanation of a suitable type of subsequent processing for substrate 20 which will include and carry out the heating of the substrate in accordance with the an alternative embodiment of the method of the present invention.

Figure 5:
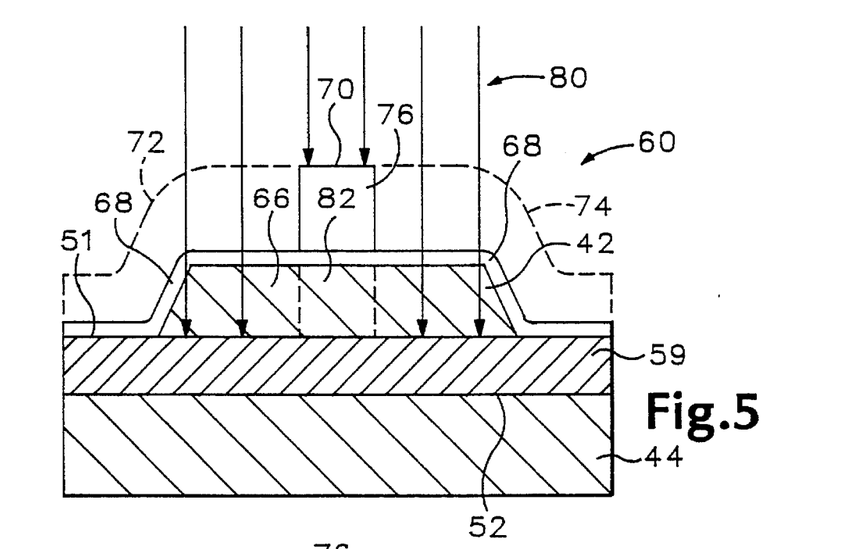
FIG. 5 is a partial cross-sectional schematic view of the substrate shown in FIG. 4 following selected steps in the subsequent processing of the wafer to create one or more active semiconductor devices on the wafer.
Figure 6:
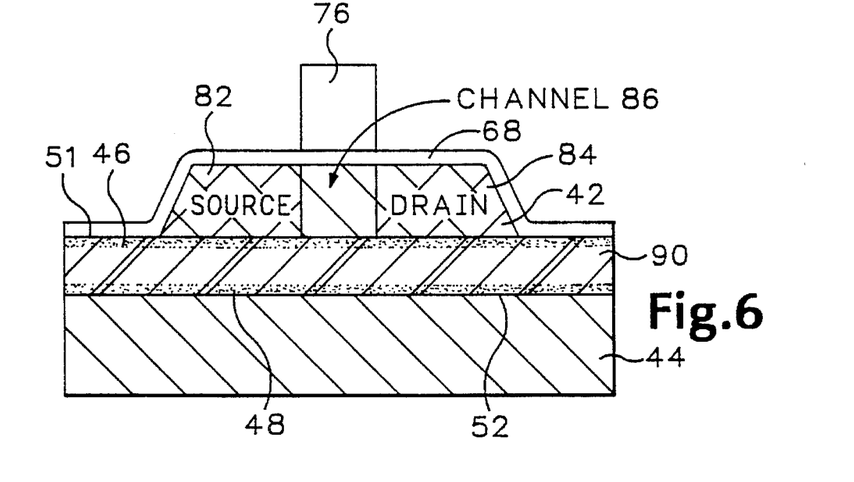
FIG. 6 is a partial cross-sectional schematic view of the substrate shown in FIG. 5 illustrating an active semiconductor device formed on the wafer.

FIGS. 5 and 6 show selected steps in the formation of an active semiconductor device 60 on substrate 20. In this example, portions of a metal-oxide-semiconductor ("MOS") field effect transistor ("FET") 60 are formed. Referring to FIG. 5, wafer 20, previously processed to include a SIMOX buried silicon dioxide layer with implanted nitrogen ions (layer 59 in FIGS. 4 and 5), is selectively etched to remove portions of upper semiconductor layer 42. Side portions of layer 42 have been removed and a central portion 66 of layer 42 remains on the substrate. The removed areas (at the left and right ends of substrate 20 in FIG. 5) expose nitrogen-implanted oxide layer 59. A surface oxide layer 68 is then grown over the exposed surfaces of substrate 20. Conventional oxidizing techniques are used to create oxide layer 68, for example, heating substrate 20 in an oxidizing atmosphere until a suitable thickness of surface oxide has formed. A layer of polysilicon 70 is then deposited over oxide layer 68. Polysilicon layer 70 is indicated by dashed lines 72, 74, and by solid lines in a central region 76 overlying the center of the unremoved part 66 of silicon layer 42. The dashed-line portions 72, 74 of polysilicon are then removed by conventional photolithographic techniques, leaving only central portion 76, which serves as a mask for the subsequent implantation step.

Next, layer 42 is implanted with suitable doping impurities to create source and drain regions within the upper silicon layer. A representative implantation beam 80 is used to direct suitable impurities, for examples arsenic or phosphorus, to create N-type conductivity regions within layer 42. Polysilicon mask 76 leaves a central channel region 82 undoped. Implantation of doping impurities into selected regions of the monocrystalline silicon of upper layer 42 leaves a structure as illustrated in FIG. 6. A central region of upper layer 42, beneath polysilicon mask 76, is free of the doping impurities and is of the opposite conductivity type from side regions 82, 84. The resultant structure is an MOS transistor having N-type source and drain regions 82, 84, respectively, separated by channel region 86 of the opposite conductivity type. FIG. 6 also illustrates the results of one or more selected heating steps used in the manufacture of semiconductor device 60. Such heating steps, known to those skilled in the art, include implantation activation and dielectric passivation, and are carried out at selected times during the formation of one or more semiconductor devices on substrate 20. The heating associated with the formation of active devices is at least sufficient to raise the temperature of substrate 20 to 700° C. for at least 10 minutes, and thus is sufficient to cause the migration of implanted nitrogen in the buried oxide layer 59 from their implantation locations around depth D to locations 46, 48 adjacent interfacial regions 51, 52, respectively. Thus, in FIG. 6, the substrate 20 is shown with the buried oxide layer 90 essentially as depicted for buried oxide layer 40 in FIGS. 1D and 3.

One desirable attribute of the method of the present invention, in conjunction with the formation of active semiconductor devices on a monocrystalline silicon substrate 20, is that it leaves upper monocrystalline silicon layer 42 free of implanted nitrogen. When nitrogen is present in monocrystalline silicon channel region 86, electron mobility through that region is impaired, which seriously degrades the performance of a MOS transistor. The method of the present invention implants nitrogen into the buried oxide insulating layer of a SIMOX substrate, and leaves upper monocrystalline silicon layer 42 substantially free of nitrogen. This process contrasts with other known prior art nitrogen passivation processes which use shallow defusion or implantation of nitrogen into surface layers of a substrate to passivate the gate oxide regions of active devices. In such prior art processes, polysilicon is employed in the source, drain, and channel regions of active devices and the incidental presence of implanted or defused nitrogen does not degrade device performance. That is because nitrogen ions do not degrade the performance of polysilicon in active devices. However, in devices formed on SIMOX substrates, wherein the source, drain, and channel regions are monocrystalline silicon, nitrogen substantially degrades electron mobility across the channel region, reducing the current between source and drain regions and severely degrading the performance of the device. Accordingly, the present invention maintains the upper silicon layer, and in particular the channel region, substantially free of implanted nitrogen, thereby avoiding degradation of the monocrystalline silicon in the channel region.

Figures 7A, 7B:
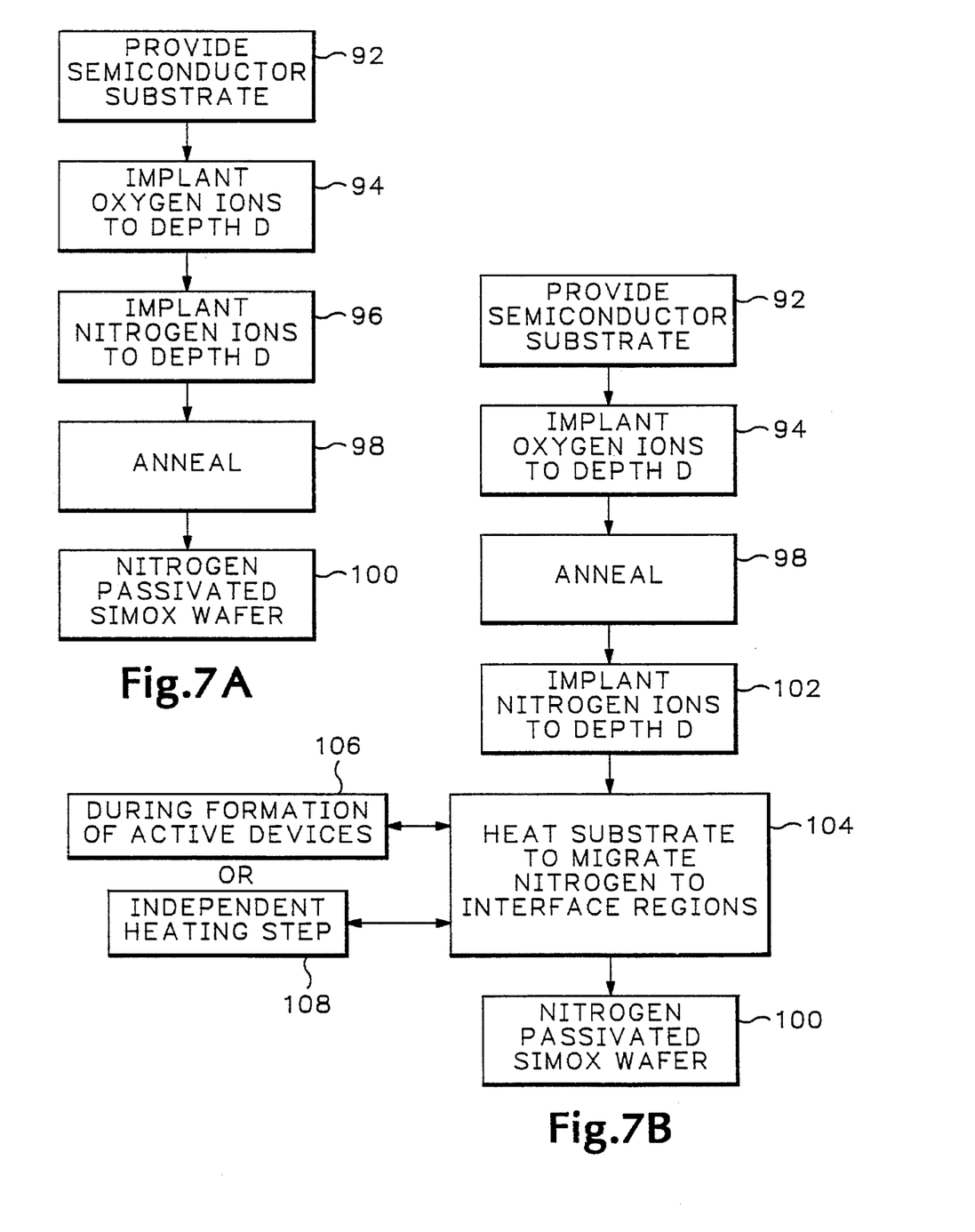
FIG. 7A is a flow diagram illustrating the steps in a first embodiment of the method of the present invention.
FIG. 7B is a flow diagram illustrating the steps in an alternative embodiment of the invention, and also illustrating two alternatives of the heating step following nitrogen implantation.
Figure 7C:
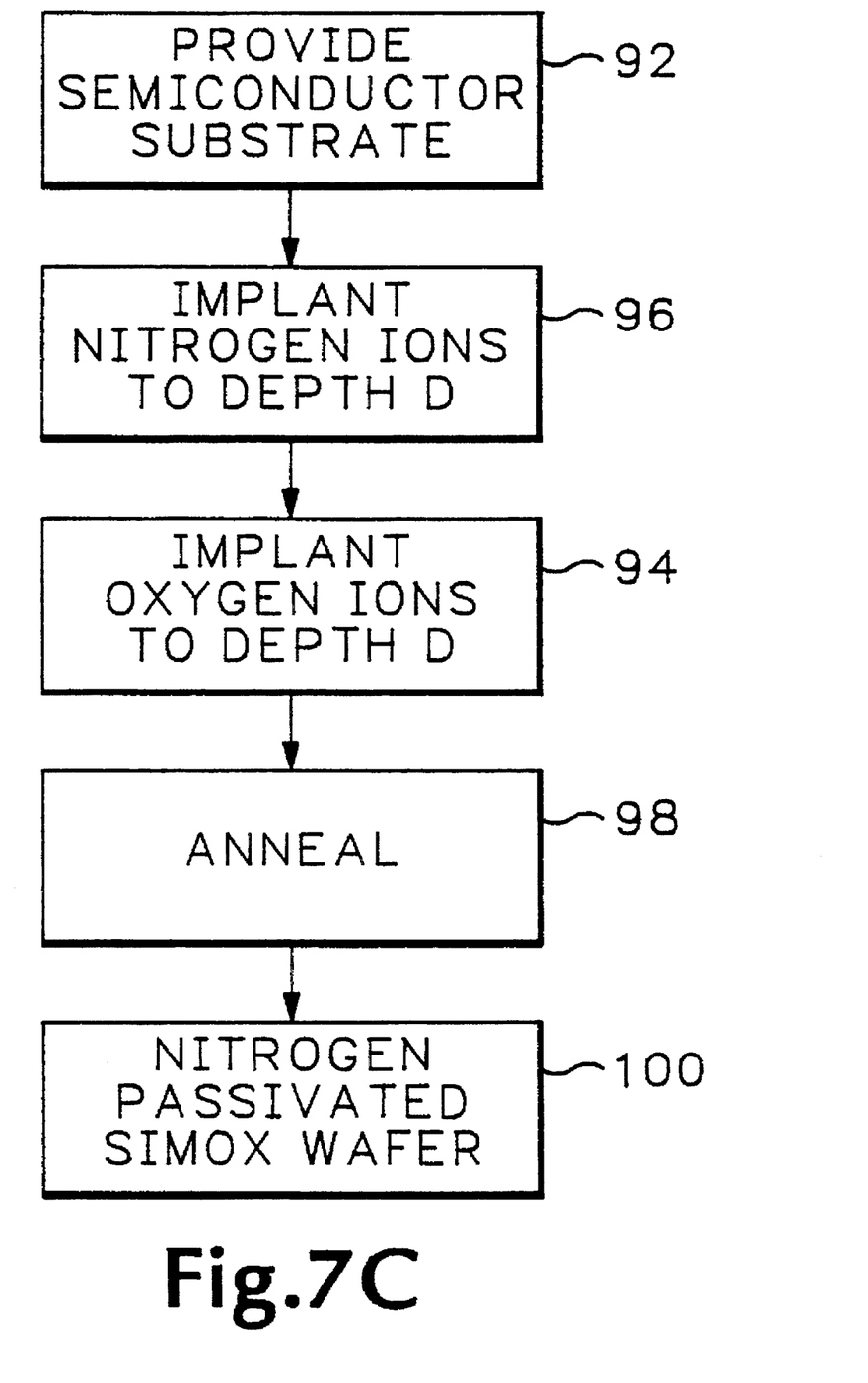
FIG. 7C is a flow diagram illustrating the steps in another alternative embodiment of the invention.

FIGS. 7A through 7C are flow diagrams illustrating several embodiments of the method of the present invention. FIG. 7A shows the steps in the first embodiment method of the present invention, previously shown and described with reference to FIGS. 1A through 1D. In the description which follows, steps in the method are described, in certain instances, by referring to reference numbers used in the preceding FIGS. 1– 6. The first step 92 is to provide a wafer of silicon or another suitable semiconductor substrate 20 having a first surface 22. The next step 94 is the implantation of oxygen ions into substrate 20 to a predetermined depth D below first surface 22. The next step 96 is the implantation of nitrogen ions to generally the same depth D as oxygen ions are implanted in Step 94. The next step 98 is to anneal substrate 20 in accordance with conventional SIMOX methodology. The final product 100 of the first embodiment method is a nitrogen passivated SIMOX wafer generally as shown in FIG. 1D.

An alternative embodiment of the method just described is shown in FIG. 7B. This embodiment of the invention generally follows a sequence of previously-described figures as follows: FIG. 1A; FIG. 1B; FIG. 4; and FIG. 1D. The first steps are steps 92 and 94, which are the same as those steps in the first embodiment. The next step 98 is the annealing of substrate 20 to form a conventional SIMOX wafer. The next step 102 is the implantation of nitrogen ions into the SIMOX wafer to the same general depth as the silicon dioxide layer 59 (step 102 is illustrated in FIG. 4). The next step 104 is heating of substrate 20 to cause migration of the implanted nitrogen ions from their implant locations to the interface regions between the buried insulation layer and the upper and lower semiconductor regions of substrate 20. The change in location of the implanted nitrogen ions caused by the heating in step 104 is illustrated generally in FIGS. 2 and 3. Heating of the substrate causes the nitrogen ions to migrate from the locations illustrated generally by curve 50 in FIG. 2 to the locations illustrated generally by curves 55, 56 in FIG. 3. Heating step 104 can be performed during subsequent processing of the wafer to form one or more active semiconductor devices on the wafer, as illustrated by step 106 in FIG. 7B. The formation of such devices is described above with reference to FIGS. 5 and 6. Heating step 104 can alternatively be carried out by an independent heating step, shown as 108 in FIG. 7B. Either alternative, 106 or 108, will produce the desired migration of nitrogen ions if the substrate is heated to a minimum of approximately 700° C. for a minimum duration of approximately 10 minutes. Regardless of the exact heating step used, the embodiment of FIG. 7B yields a nitrogen passivated SIMOX wafer 100, as in the first embodiment.

Another alternative embodiment of the method of the present invention is illustrated in FIG. 7C. In this embodiment steps 94 and 96 of the first embodiment are reversed. The step 96 of implanting nitrogen ions is performed before step 94 of implanting oxygen ions into substrate 20. The remaining steps in the embodiment illustrated in FIG. 6C are the same as in the first embodiment. In carrying out steps 94 and 96, it should be understood that the depth to which the nitrogen ions are implanted in substrate 20 is based on the predetermined depth D to which oxygen ions will be implanted in the oxygen ion implantation step to follow. The method of the present invention can be carried out successfully regardless of the order in which oxygen ions and nitrogen ions are implanted in substrate 20. It is only necessary that the step 96 of implanting nitrogen ions be carried out such that the nitrogen ions are implanted to the same general depth below top surface 22 as the oxygen ions are implanted in step 94. For example, if a predetermined oxygen implantation dose and energy are planned for step 94 in order to create a buried insulating layer 40 centered at a selected depth D below first surface 22, the nitrogen implantation step 96 is carried out using a selected implantation dose and energy, in accordance with the present invention, to center the Gaussian distribution of nitrogen ions at approximately the same depth D. More specifically, if a predetermined oxygen ions are to be implanted in substrate 20 with a dose generally in the range of between $1.0 \times 10^{17}$ to $3.0 \times 10^{18}$ ions/cm$^2$ and a ion implantation energy generally in the range of 30 KeV to 120 KeV, the method illustrated in FIG. 7C will preferably use, in nitrogen implantation step 96, an implant dose generally in the range of $1.0 \times 10^{11}$ to $1.0 \times 10^{13}$ ions/cm$^2$ and an ion implantation energy generally in the range of between zero percent (0%) to twenty-five percent (25%) less than the ion implantation energy which is to be used in the subsequent oxygen implantation step 94.

Mother alternative embodiment of the invention, not shown separately in the figures, is a variation of the first embodiment shown in FIG. 7A, and of the embodiment shown in FIG. 7C. In this alternative embodiment, steps 94 and 96 are carried substantially simultaneously. In other words, both oxygen ions and nitrogen ions are implanted in substrate 20 to generally the same depth D during a single operation, with the nitrogen ion beam and the oxygen ion beam used in close sequence during a single visit to a processing chamber. The remaining steps in this alternative would be the same as in the first embodiment of FIG. 7A and the embodiment of FIG. 7C.

It has been found that the use of implanted nitrogen ions to passivate the interface regions of a SIMOX buried oxide semiconductor substrate yields superior results compared with other forms of passivation, such as hydrogen passivation. Deep-buried oxide insulating layers can be readily passivated by diffusion of hydrogen molecules into the substrate, as is well known in the art. However, hydrogen does not form stable bonds with the broken silicon and oxygen molecules and, under operating conditions when the device is subjected to normal electrical fields, the hydrogen bonds are again broken and the passivating effect is lost. Nitrogen bonds have proven to be much more durable and successfully passivate the interface regions surrounding a buried oxide insulation layer. Use of implanted nitrogen in the formation of a SIMOX substrate avoids incidental implantation of nitrogen into superficial monocrystalline gate silicon in active devices, where the presence of nitrogen is undesirable and degrades device performance. On the other hand, the presence of nitrogen in the interface regions of the buried oxide, in accordance with the present invention, substantially enhances the electrical isolation provided by the insulating layer. The invention reduces the trapped electron density of the substrate, reduces trapped charge, increases gate oxide strength, and generally enhances the performance and reliability of devices formed on the substrate.

What is claimed is:

1. In a process for making a semiconductor substrate in which a buried insulating layer is formed between upper and lower semiconductor regions, a method of increasing the electrical isolation between the upper and lower semiconductor regions comprising the following steps:

(a) forming a buried insulating layer in a buried insulator region;

(b) implanting nitrogen ions into the substrate to form a distribution of nitrogen ions centered at the same general depth as the center of the buried insulating layer region; and (c) heating the substrate to cause migration of nitrogen ions to the interface regions between the buried insulating layer and the upper and lower semiconductor regions, whereby the nitrogen passivates said interface regions.

2. A method as in claim 1 in which the buried insulating layer is formed in the substrate by steps which include implanting oxygen ions into the substrate to form a distribution of oxygen ions centered at an implant depth within the substrate and annealing said substrate to form a buried layer of oxide, said step (b) of implanting nitrogen ions is performed before the step of implanting oxygen ions into the substrate and includes implanting nitrogen ions to a depth which forms a distribution of nitrogen ions centered at generally the same implant depth at which the distribution of oxygen ions is centered when the oxygen ions are implanted into the substrate, and said step (c) of heating the substrate is performed during the step of annealing said substrate to form a buried layer of oxide.

3. A method as in claim 1 in which the buried insulating layer is formed in the substrate by steps which include implanting oxygen ions into the substrate to form a distribution of oxygen ions centered at an implant depth within the substrate and annealing said substrate to form a buried layer of oxide, said step (b) of implanting nitrogen ions is performed after the step of implanting oxygen ions into the substrate and includes implanting nitrogen ions to a depth which forms a distribution of nitrogen ions centered at generally the same implant depth at which the distribution of oxygen ions is centered when the oxygen ions are implanted into the substrate, and said step (c) of heating the substrate is performed during the step of annealing said substrate to form a buried layer of oxide.

4. A method as in claim 1 in which the buried insulating layer is formed in the substrate by steps which include implanting oxygen ions into the substrate to form a distribution of oxygen ions centered at an implant depth within the substrate and annealing said substrate to form a buried layer of oxide, said step (b) of implanting nitrogen ions is performed simultaneously with the step of implanting oxygen ions into the substrate and includes implanting nitrogen ions to a depth which forms a distribution of nitrogen ions centered at generally the same implant depth at which the distribution of oxygen ions is centered when the oxygen ions are implanted into the substrate, and said step (c) of heating the substrate is performed during the step of annealing said substrate to form a buried layer of oxide.

5. A method as in claim 1 in which the buried insulating layer is formed in the substrate by steps which include implanting oxygen ions into the substrate to form a distribution of oxygen ions centered at an implant depth within the substrate and annealing said substrate to form a buried layer of oxide, said step (b) of implanting nitrogen ions is performed after the steps of implanting oxygen ions into the substrate and annealing said substrate to form a buried layer of oxide and step (b) further includes implanting the nitrogen ions to a depth which forms a distribution of nitrogen ions centered generally at the same implant depth at which the distribution of oxygen ions is centered when the oxygen ions are implanted into the substrate.

6. A method as in claim 1 in which the implant dose used in nitrogen implanting step (b) is in the range of about $1.0 \times 10^{11}$ to $1.0 \times 10^{13}$ ions/cm$^2$.

7. A method as in claim 1 in which the buried insulating layer is formed in the substrate by steps which include implanting oxygen ions through a first surface of the substrate to form a distribution of oxygen ions centered at an implant depth beneath the first surface using an implant dose in the range of about, $1.0 \times 10^{17}$ to $3.0 \times 10^{18}$ ions/cm$^2$ and an on implantation energy in the range of about 30 KeV to 120 KeV, and said step (b) of implanting nitrogen ions into the substrate uses an implant dose in the range of about $1.0 \times 10^{11}$ to $1.0 \times 10^{13}$ ions/cm$^2$ and an ion implantation energy which is in the range of between about zero percent (0%) to twenty-five percent (25%) less than the ion implantation energy used to implant oxygen ions into the substrate.

8. A method as in claim 1 in which said step (c) of heating the substrate includes heating the substrate to a temperature of at least 700° C. for at least 10 minutes.

9. A method as in claim 8 in which said step (c) of heating the substrate includes heating the substrate to a temperature in the range of about 700° C. to 1000° C. for a duration in the range of about 10 minutes to 30 minutes.

10. In a process for making a buried-oxide semiconductor substrate in which a buried oxide layer is formed between upper and lower semiconductor regions of the substrate by steps which include (1) implanting oxygen ions through a first surface of the substrate to form a distribution of oxygen ions centered at an implant depth beneath the first surface, and (2) annealing the substrate to form the buried oxide layer within the substrate, a method of increasing the electrical isolation between the upper and lower semiconductor regions comprising:

(a) at any time during the processing of the substrate to form the buried oxide layer, including preceding step (1), between steps (1) and (2), and subsequent to step (2), implanting nitrogen ions into the substrate through said first surface to a depth which forms a distribution of nitrogen ions centered at about the center of the implant depth of the oxygen ions implanted in step (1);

and (b) during or after the annealing step (2) in which the buried oxide layer is formed in the substrate, heating the substrate to cause migration of the nitrogen ions to the interface regions between the buried oxide layer and the upper and lower semiconductor regions, whereby the nitrogen passivates the interface regions and increases the electrical isolation between the upper and lower semiconductor regions.

11. A method as in claim 10 in which oxygen implantation step (1) is carried out by directing an oxygen ion beam through said first surface using an implant dose in the range of about $1.0 \times 10^{17}$ to $3.0 \times 10^{18}$ ions/cm$^2$ and an ion implantation energy in the range of about of 30 KeV to 120 KeV and nitrogen implantation step (a) is carried out by directing a nitrogen ion beam through said first surface using an implant dose in the range of about $1.0 \times 10^{11}$ to $1.0 \times 10^{13}$ ions/cm$^2$ and an ion implantation energy which is in the range of between about zero percent (0%) to twenty-five percent (25%) less than the ion implantation energy used to implant oxygen ions into the substrate in step (1).

12. A method as in claim 10 in which step (a) is carried out by directing a nitrogen ion beam through said first surface using an implant dose in the range of about $1.0 \times 10^{11}$ to $1.0 \times 10^{13}$ ions/cm$^2$.

13. A method as in claim 10 in which the implant depth of the oxygen ions implanted in step (1) and the depth of the center of the distribution of nitrogen ions implanted in step (a) exceeds approximately 3,000 Å beneath said first surface of the substrate.

14. In the formation of an active semiconductor device having a monocrystalline silicon channel region on a SIMOX semiconductor substrate, a method of increasing the electrical isolation between an upper silicon layer extending above a buried silicon dioxide layer and a lower silicon layer extending below the silicon dioxide layer, the method comprising the following steps:

(a) providing a monocrystalline silicon substrate having a first surface;

(b) implanting oxygen ions in said substrate to form a distribution of oxygen ions centered at an implant depth below said first surface;

(c) annealing said substrate to form a buried silicon dioxide layer in said substrate extending between the upper and lower silicon layers;

(d) implanting nitrogen ions into the substrate to a depth which forms distribution of nitrogen ions centered generally at the center of the implant depth of the oxygen ions implanted in step (b);

(e) forming an active semiconductor device on the substrate, including using a portion of said upper silicon layer for the channel region of the device, and including maintaining said channel region substantially free of implanted nitrogen, whereby degradation of the monocrystalline silicon in the channel region is avoided; and (f) heating the substrate to cause migration of nitrogen ions to the interface regions extending between the silicon dioxide layer and the upper and lower silicon layers, whereby the nitrogen passivates said interface regions.

15. A method as in claim 14 in which said step (f) of heating the substrate is performed during step (e) as part of the process of forming the active semiconductor device on the substrate.

16. A method as in claim 14 in which step (d) is performed at one of the following selected times: following step (c), or simultaneously with step (b), or preceding step (b).

* * * * *